United States Patent [19]

Hongu et al.

[11] 4,115,737
[45] Sep. 19, 1978

[54] MULTI-BAND TUNER

[75] Inventors: Masayuki Hongu, Komae; Tsutomu Niimura, Hiratsuka; Hiromi Kawakami, Yokohama, all of Japan

[73] Assignee: Sony Corporation, Tokyo, Japan

[21] Appl. No.: 851,283

[22] Filed: Nov. 14, 1977

Related U.S. Application Data

[63] Continuation-in-part of Ser. No. 739,275, Nov. 5, 1976, abandoned.

[30] Foreign Application Priority Data

Nov. 13, 1975 [JP] Japan .................. 50-136622

[51] Int. Cl.² ........................ H04B 1/06
[52] U.S. Cl. ......................... 325/459; 325/388; 325/437; 325/344
[58] Field of Search .............. 325/308, 344, 388, 427, 325/435–439, 453, 458, 461, 462, 473, 477, 489, 490; 358/191, 167; 334/18

[56] References Cited

U.S. PATENT DOCUMENTS

| | | | |
|---|---|---|---|
| 3,639,840 | 2/1972 | Shekel | 325/308 |
| 3,931,578 | 1/1976 | Gittinger | 325/461 |
| 3,942,120 | 3/1976 | Ham | 325/437 |
| 4,009,441 | 2/1977 | Kumagai et al. | 325/461 |
| 4,045,740 | 8/1977 | Baker | 325/427 |

Primary Examiner—Robert L. Griffin
Assistant Examiner—Jin F. Ng
Attorney, Agent, or Firm—Lewis H. Eslinger; Alvin Sinderbrand

[57] ABSTRACT

A tuner for receiving signals broadcast on two spaced bands, each divided into several channels, has two fixed bandpass filters, one to pass all of the channels in the lower band between the lowest frequency $f_P$ of the lowest channel and the highest frequency $f_S$ of the highest channel of the lower band, and the other to pass all of the channels in the upper frequency band between the lowest frequency $f_T$ of the lowest channel and the highest frequency $f_W$ in the highest channel of the upper band. The bandwidth of each channel is $f_B$. The tuner includes an amplifier and a third filter to which signals of either band are supplied by selective operation of a switch. The third filter has a cut-off frequency below the second harmonic of the lowest frequency of the upper band to simplify the avoidance of image interference from second harmonic signals of the band. A tunable local oscillator supplies a heterodyning signal to the mixer to convert any selected channel of the received signal to an intermediate frequency (i.f.) band, and image interference is avoided by setting the local oscillator frequency $f_n$ required to convert channel $n$ to the i.f. at a frequency above that channel such that the lowest frequency $f_L$ of the i.f. band satisfies the following conditions:

$$f_L > \frac{f_S - f_P - f_B}{2} \quad (1)$$

$$f_L > \frac{f_W - f_T - f_B}{s,59\ 2} \quad (2)$$

$$\left. \begin{array}{l} \text{and either } f_L < \frac{2f_P - f_S - f_B}{2} \\ \text{or } f_L > \frac{2f_S - f_P - f_B}{2} \end{array} \right\} \quad (3)$$

8 Claims, 5 Drawing Figures

MULTI-BAND TUNER

BACKGROUND OF THE INVENTION

Field of the Invention

This is a continuation-in-part of application Ser. No. 739,275 filed Nov. 5, 1976, now abandoned.

This invention relates to a multi-channel tuner comprising a pair of filters, each with a fixed, relatively broad pass band to pass only channels in one of the bands, and switching means associated therewith to connect the filter for the band containing a desired channel through an amplifier and second-harmonic suppression filter to a mixer. A local oscillator supplies a conversion carrier to the mixer to convert the desired channel to an intermediate frequency band chosen to minimize interference from other channels in the same band.

DESCRIPTION OF THE PRIOR ART

It has been customary in prior art television tuners for VHF channels to provide an input filter between the antenna and a high frequency amplifier and another filter between the high frequency amplifier and a mixer circuit. Such filters have heretofore been tunable to the desired channel to prevent signals from other channels from reaching the mixer. Each tuner has also included a tunable local oscillator to supply a heterodyning signal to the mixer to convert the signal in the desired channel to a fixed intermediate frequency band.

It has long been known that the heterodyning, or frequency conversion, of signals to an intermediate frequency band raises the possibility of interference from undesired signals having a specific frequency relationship to the desired signals. However, it is also well known that a high frequency input amplifier having filters tunable to pass only the desired channel eliminates most of the undesired signals.

Filters tunable to each of the VHF channels are complicated and expensive, but they have heretofore been considered essential to minimize or eliminate interference.

SUMMARY OF THE INVENTION

It is one object of the invention to provide a tuner of relatively simpler construction than the above-described prior art tuners.

It is another object of the invention to provide a multiband, multi-channel tuner with fixed filter means having relatively broad bandpass characteristics and switching means between the antenna and the mixer to allow only the channels (including the desired channel) in one band at a time to pass through an amplifier and a harmonic-suppression filter to the mixer.

According to the present invention, a tuner to receive signals in channels grouped into two bands has an input section comprising two filters and switch means, such as a double-throw switch, between an input terminal and a mixer. An amplifier and a harmonic-suppression filter are included between the switching means and the mixer. Each of the first two filters in the input section of the tuner has a fixed pass band that transmits only the channels in one band, and the switching means allows only the filter that passes the band that includes the desired channel to pass signals from the input terminal through the amplifier and suppression filter to the mixer.

In accordance with standard superheterodyne receiver practice, the tuner includes a local oscillator to supply a signal to the mixer to convert the desired channel to a fixed intermediate frequency (i.f.) band. The use of input section filters with relatively broad pass bands, each capable of passing several channels, instead of relatively narrow pass bands capable of passing only a single channel simplifies the construction of the tuner but places some constraints on the selection of the intermediate frequency band. For tuners in which the local oscillator frequency is higher than the desired channel, a frequency relationship that is also known as upper heterodyning, and the bandwidth of each channel is $f_B$, the following conditions must be met:

(a) There must be no image frequency interference between any two channels in the same band. This can be prevented if the lowest frequency $f_L$ of the i.f. band is selected to be high enough so that the local oscillator frequency that must be mixed with the lower band channels to convert the lowest of those channels to the i.f. band simultaneously converts the highest channel of that band to a band entirely below the frequency $f_L$. Mathematically this is true if:

$$f_L > \frac{f_S - f_P - f_B}{2} \qquad (1)$$

for the lower band, and, for the upper band, $$f_L > \frac{f_W - f_T - f_B}{2} \qquad (2)$$

(b) Either there must be no image interference between the highest frequency in the highest channel in the lower band and the lowest second harmonic frequency of the lowest channel in that band, or the local oscillator frequency must be such that there will be no image interference between the second harmonic of the highest frequency in the band and the highest frequency of the lowest channel in the band. Expressed mathematically for the same lower band as before, and including the definition that the lowest intermediate frequency $f_L$ is equal to the highest intermediate frequency $f_H$ minus the bandwidth $f_B$ this is:

$$\left.\begin{array}{l} \text{either } f_L < \dfrac{2f_P - f_S - f_B}{2} \\[6pt] \text{or } \quad f_L > \dfrac{2f_S - f_P - f_B}{2} \end{array}\right\} \qquad (3)$$

Other objects, features, and advantages of the present invention will become apparent from the following description taken in conjunction with the accompanying drawings.

BRIEF DESCRIPTION OF THE DRAWINGS

FIGS. 3 through 5 are frequency spectrum diagrams for explaining the frequency relations in the circuit in FIG. 1.

DESCRIPTION OF THE PREFERRED EMBODIMENT

Figure 1:
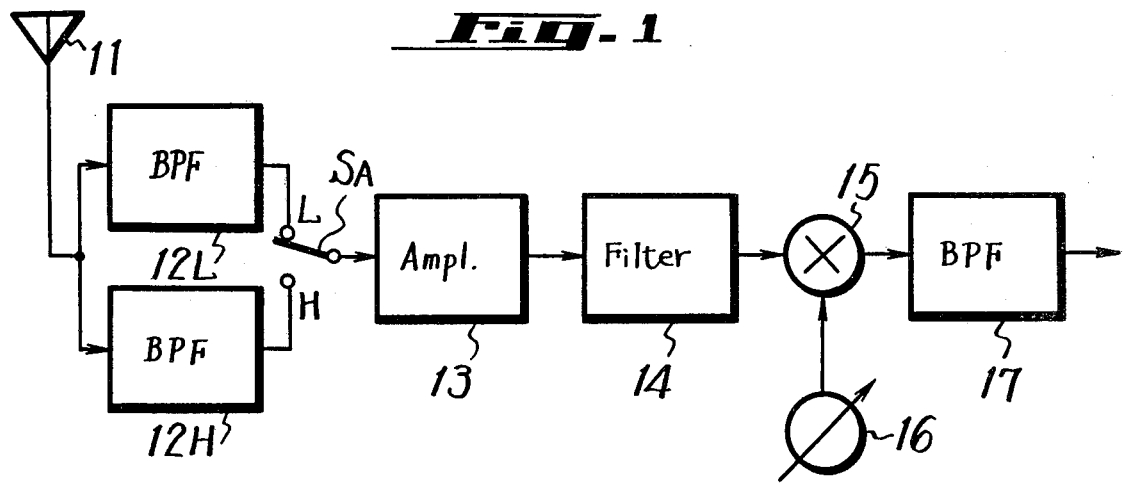
FIG. 1 is a block diagram of an embodiment of the present invention.

In FIG. 1 an antenna 11 receives broadcast signals and connects them to a first bandpass filter 12L and to a second bandpass filter 12H. In the embodiment illustrated, the output terminals of the filters 12L and 12H are connected, respectively, to terminals L and H of a double-throw switch $S_A$. Each of the filters has a fixed pass band, that of the filter 12H covering a range of higher frequencies than that of the filter 12L. For example, the tuner may be arranged to receive VHF television signals which are broadcast in two bands, each having several channels. In accordance with Japanese government standards, the lower band of television signals includes three channels, numbered 1 through 3 and each having a bandwidth $f_B$ of 6MHz, from a lowest frequency $f_P$ of 90MHz to a highest frequency $f_S$ of 108MHz. The same standards provide for an upper band that includes nine channels numbered 4 through 12 and each having the same bandwidth but with an overlap of 2MHz between channels 7 and 8, so that the upper band extends from a lowest frequency $f_T$ of 170MHz to a highest frequency $f_W$ of 222Mhz. The filter 12L to receive the lower band has a fixed bandpass of 90MHz to 108MHz and the filter 12H has a bandpass of 170MHz to 222MHz.

The U.S. standards established by the Federal Communications Commission require that VHF television signals be separated into a lower band containing channels numbered 2 through 6 and each having a bandwidth $f_B$ of 6MHz and extending from a lowest frequency $f_P$ of 54MHz to a highest frequency $f_S$ of 88MHz, and an upper band containing channels numbered 7 through 13 and extending from a lowest frequency $f_T$ of 176MHz to a highest frequency $f_W$ of 216MHz.

Although the specific frequencies in the Japanese and U.S. standards are different, the conversion principles are the same. The only channels that need to be considered in order to prevent image interference are the lowest and highest channels of the lower and upper bands. Within those four channels, only the lowest and highest frequencies need be considered, and, instead of using channel numbers, it is more convenient to designate the lowest and highest frequencies, respectively, of the lowest channel of the lower band as $f_P$ and $f_Q$ and the lowest and highest frequencies, respectively, of the highest channel of the lower band as $f_R$ and $f_S$. The lowest and highest frequencies of the lowest channel of the upper band are $f_T$ and $f_U$, respectively, and the lowest and highest frequencies of the highest channel of the upper band are $f_V$ and $f_W$, respectively.

The switch $S_A$ has an arm that can make contact with either of the fixed contacts L or H, depending on whether the user wants to receive one of the channels in the lower band or one of the channels in the upper, or higher, band. The arm of the switch, which is also the output terminal thereof, is connected to a high frequency amplifier circuit 13, the output of which is connected to a filter 14. Filter 14 is a low pass or bandpass filter which passes therethrough signals in the lower band and signals in the upper band respectively, the upper cut-off frequency of the filter bandpass being below the second harmonic of the lowest frequency of the upper band. The output of the filter 14 is connected to a mixer 15. A local oscillator 16 is also connected to the mixer to supply signals to be multiplied by, or heterodyned with, signals that reach the mixer by way of the amplifier 13. The output signal of the mixer 15 is applied to a filter 17, the pass band of which is fixed and is the i.f. band of the tuner.

In order to convert the frequency of a desired channel to a fixed i.f. band, the local oscillator frequency must be set at the proper frequency. It is well known that heterodyne operation can result in undesired interference signals in the i.f. band. Customarily, the effects of these interference signals have been minimized or eliminated by providing a tunable input section having one or more filters tunable to each channel in each band and having bandpass characteristics to allow only the desired channel to pass through to the mixer while attenuating other received signals. In accordance with the present invention, the pass bands of the filters 12L and 12H are relatively broad, so that different limitations, or constraints, apply in choosing an i.f. band that will prevent image interference.

The i.f. band has a lower frequency $f_L$ and an upper frequency $f_H$. The difference between these frequencies is the i.f. bandwidth $f_B$, which, in the case of television signals, is 6MHz. The local oscillator frequencies required to convert the frequencies of the received channels to the i.f. band will be designated as $f_n$, where $n$ corresponds to the channel number.

Figure 3:
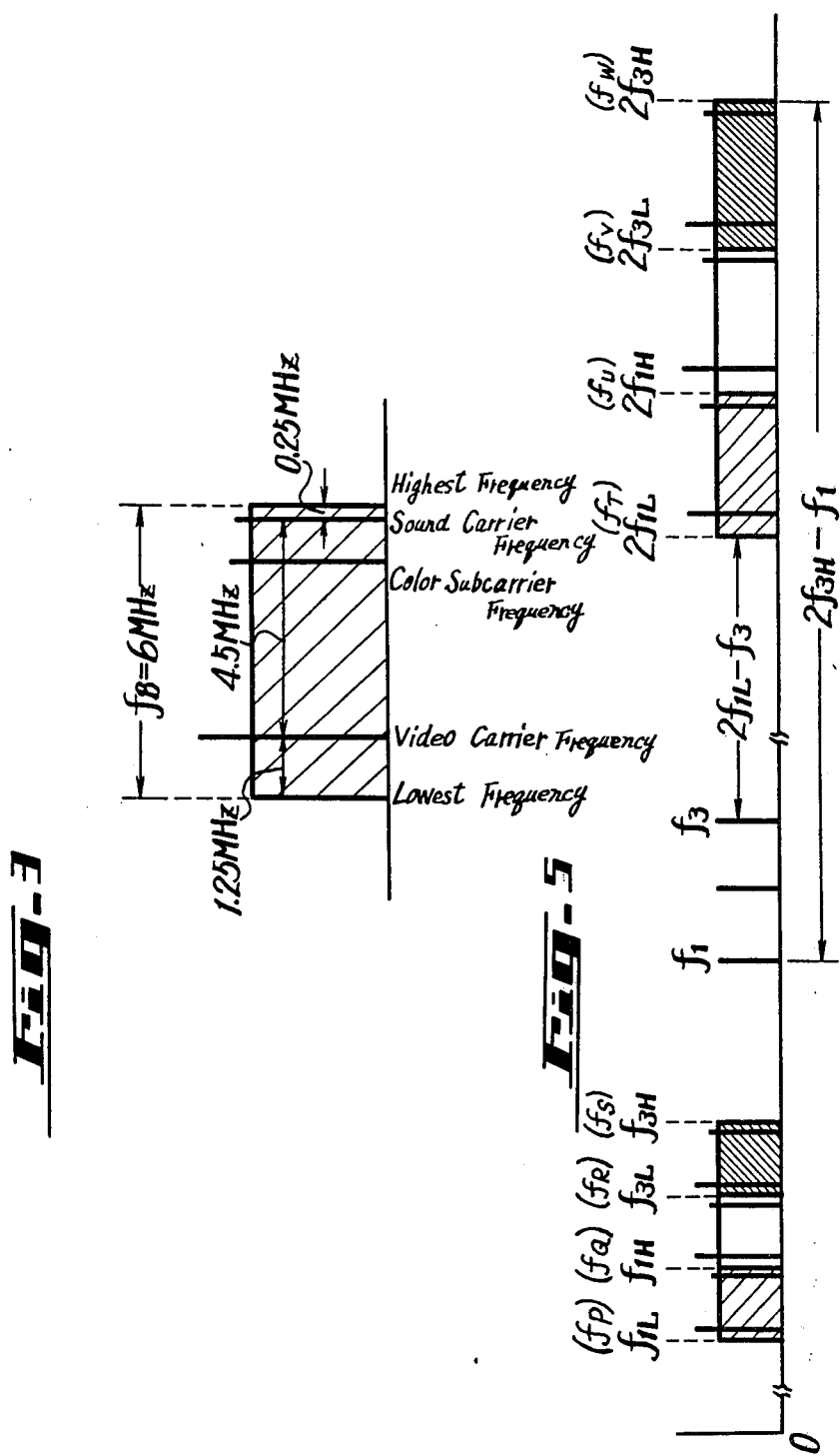

FIG. 3 represents the frequency spectrum of a single television channel. The overall bandwidth $f_B$ is 6MHz, the video, or picture, carrier frequency is 1.25MHz above the lowest frequency, and there is a fixed frequency difference of 4.5MHz between the video and sound carrier frequencies. Therefore, the sound carrier frequency is 0.25MHz below the highest frequency of the channel. If color signals are being broadcast, there is a color subcarrier frequency, which is standardized in the United States at 3.579545MHz above the video carrier frequency.

Figure 4:
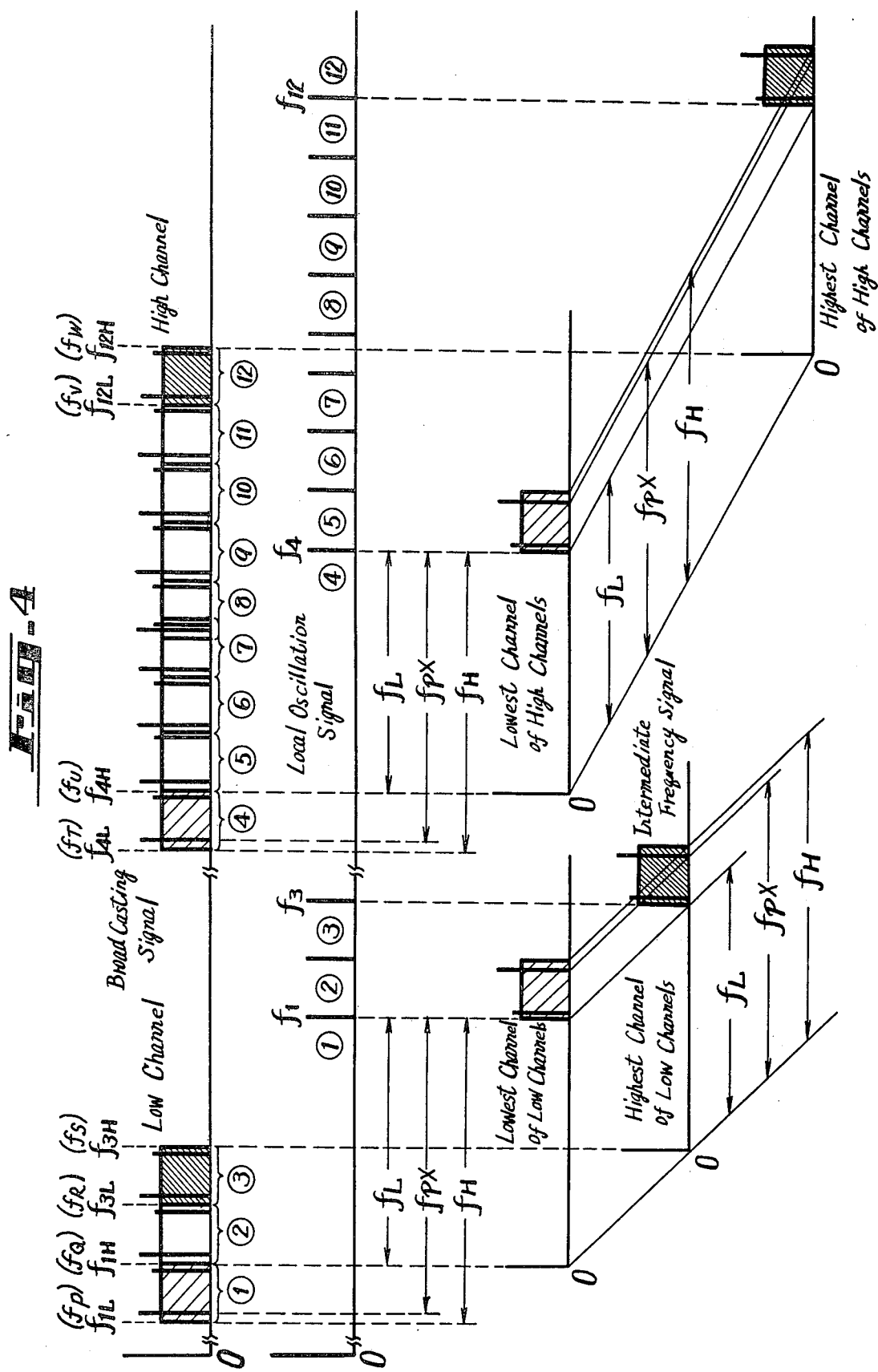

FIGS. 4 and 5 show frequency spectrum diagrams used for explaining selection of the preferred i.f. band for a frequency conversion relationship designated as an upper heterodyne system in which the local oscillator frequency $f_n$ is above the frequencies of the desired channel. From FIG. 4 it will be apparent that the lowest frequency $f_L$ in the i.f. band is equal to the difference between the local oscillator frequency for any channel and the highest frequency of that channel. In particular, FIG. 4 shows that for $n = 1$, $f_1 = f_Q + f_L$, or, revising the latter equation to refer to $f_P$ which is equal to $f_Q - f_B$, $$f_1 = f_P + f_B + f_L$$

If $f_L$ is greater than $(f_S - f_1)$, the following condition is true:

$$f_L > f_S - f_1 = f_S - (f_P + f_B + f_L)$$

or, rearranging, $$f_L > \frac{f_S - f_P - f_B}{2} \quad (1)$$

According to condition (1), if the switch $S_A$ is set to allow only the lower band to reach the mixer 15, and if the frequency of the local oscillator is at a frequency $f_1$ to convert the lowest-frequency channel, no signals from the other lower band channels will be converted to the i.f. band if the lowest frequency $f_L$ in the i.f. band is higher than one-half the difference between the highest frequencies $f_S$ and $f_Q$, respectively, of the highest and lowest channels of that band. There is no need to be concerned about interference from channels in the upper band, because such signals could not pass through the filter 12L and the switch $S_A$.

The same procedure can be used to select a frequency $f_L$ based on frequencies of the channels in the upper band. If the lowest frequency $f_L$ in the i.f. band is selected to be higher than the difference between the highest frequency of the highest channel in the upper band and the local oscillator frequency for converting the lowest channel in that band, the following condition is defined.

$$f_L > f_W - f_4$$

Since $$f_4 = f_L + f_U = f_L + f_T + f_B,$$

or, rearranging, $$f_L > \frac{f_W - f_T - f_B}{2} \quad (2)$$

The values of $f_L$ that satisfy condition (1) are not necessarily the same as those that satisfy condition (2). These conditions merely set lower limits to the frequency $f_L$. If, for example, the frequency limit set by condition (1) is that the frequency $f_L$ must be greater than 6MHz, while the limit set by condition (2) is that the frequency $f_L$ must be greater than 23MHz, the choice of an i.f. band that has a lower frequency of 23MHz or higher will satisfy both conditions.

Although the filter 12L prevents frequencies higher than about $f_S$ from reaching the amplifier 13, when the arm of the switch $S_A$ is in contact with the terminal L, the amplifier 13 can produce harmonics of these relatively low frequency signals. The filter 14 can cut off frequencies below the second harmonic $2f_T$ of the lowest frequency of the upper band (provided $2f_T$ is greater than $f_W$, the highest frequency of the upper band), so it is only necessary to select the i.f. band to avoid image interference between the lower band and its second harmonic.

FIG. 5 shows the relationship between the lower band, the local oscillator frequencies, and the second harmonic of the lower band. As always in an upper heterodyne system, the lowest frequency $f_L$ in the i.f. band is defined as the difference between the local oscillator frequency and the highest frequency in the channel converted by that local oscillator frequency. Using the Japanese frequency allocations in which the highest channel in the lower band is channel 3 and its highest frequency is $f_S$ and the local oscillator frequency that converts channel 3 to the i.f. band is therefore designated as $f_3$, the frequency $f_L$ is $$f_L = f_3 - f_S.$$

The highest frequency $f_H$ in the i.f. band is $$f_H = f_L + f_B.$$

There can be no image interference between any of the channels in the lower band and the second harmonics of those channels if the lowest second harmonic frequency $2f_P$ is greater than the sum of the local oscillator frequency for the highest channel of the lower band and the highest i.f. frequency $f_H$. Or, stated symbolically, $$2f_P > f_3 + f_H$$

By substituting $f_S + f_L$ for $f_3$ and $f_L + f_B$ for $f_H$, $$2f_P > f_S + f_L + f_L + f_B$$

or, rearranging to obtain the necessary value of $f_L$, $$f_L < \frac{2f_P - f_S - f_B}{2} \quad (3A)$$

Alternatively, if the image frequency of the lowest channel in the lower band were higher than the highest second harmonic frequency $2f_S$, no image interference could occur. The image frequency of the lowest channel, which lies between $f_P$ and $f_Q$, is in the band between $f_Q + 2f_L$ and $f_Q + 2f_L + f_B$. Since $f_Q + 2f_L$ is a lower frequency than $f_Q + 2f_L + f_B$, the requirement for avoiding interference will be achieved if $$2f_S < f_Q + 2f_L$$

This inequality may be rearranged to show $$2f_L > 2f_S - f_Q$$

or, by substituting the equivalent value $f_P + f_B$ for $f_Q$ and dividing the result by 2, this inequality becomes $$f_L > \frac{2f_S - f_P - f_B}{2} \quad (3B)$$

The frequencies of the respective VHF television channel signals in Japan are shown in the following Table I, where $f_B$ = 6MHz and the video and sound carriers have the relationships described in connection with FIG. 3.

Table I

| | Channel | Lowest Frequency (MHz) | Video Carrier Frequency (MHz) | Sound Carrier Frequency (MHz) | Highest Frequency (MHz) |
|---|---|---|---|---|---|
| Low Channel | 1 | 90 ($=f_P$) | 91.25 | 95.75 | 96($=f_Q$) |
| | 2 | 96 | 97.25 | 101.75 | 102 |
| | 3 | 102($=f_R$) | 103.25 | 107.75 | 108($=f_S$) |
| High Channel | 4 | 170($=f_T$) | 171.25 | 175.75 | 176($=f_U$) |
| | 5 | 176 | 177.25 | 181.75 | 182 |
| | 6 | 182 | 183.25 | 187.75 | 188 |
| | 7 | 188 | 189.25 | 193.75 | 194 |
| | 8 | 192 | 193.25 | 197.75 | 198 |
| | 9 | 198 | 199.25 | 203.75 | 204 |
| | 10 | 204 | 205.25 | 209.75 | 210 |
| | 11 | 210 | 211.25 | 215.75 | 216 |
| | 12 | 216($=f_V$) | 217.25 | 221.75 | 222($=f_W$) |

The frequencies $f_P$ through $f_W$ as allocated in the United States are listed in Table II.

Table II

| | | | |
|---|---|---|---|
| Channel 2 | $f_P$ = 54MHz | $f_Q$ = 60MHz | |
| | | | Lower Band |
| Channel 6 | $f_R$ = 82MHz | $f_A$ = 88MHz | |
| Channel 7 | $f_T$ = 174MHz | $f_U$ = 180MHz | |
| | | | Upper Band |
| Channel 13 | $f_V$ = 210MHz | $f_W$ = 216MHz | |

Applying the values listed in Table I to determine the proper value for $f_L$ in Japan, condition (1) gives the following condition (4):

$$f_L > \frac{f_S - f_P - f_B}{2} = 6\text{MHz} \tag{4}$$

Condition (2) gives the following condition (5):

$$f_L > \frac{f_W - f_T - f_B}{2} = 23\text{MHz} \tag{5}$$

The alternative conditions (3A) and (3B) give the following condition (6):

$$\left. \begin{array}{l} f_L < \dfrac{2f_P - f_S - f_B}{2} = 33\text{MHz} \\ \text{or} \\ f_L > \dfrac{2f_S - f_P - f_B}{2} = 60\text{MHz} \end{array} \right\} \tag{6}$$

Accordingly, the following condition 7 will satisfy all the conditions (6) to (8).

$$23\text{MHz} < f_L < 33\text{MHz}$$

or $$f_L > 60\text{MHz} \tag{7}$$

If the video intermediate frequency is taken as $f_{px}$, $f_{px} = f_L + 4.75\text{MHz}$. Therefore, it is enough that $f_{px}$ satisfies the following condition (8).

$$27.75\text{ MHz} < f_{px} < 37.75\text{MHz}$$

or $$f_{px} > 64.75\text{MHz} \tag{8}$$

If, in addition to the above conditions (1) to (3), the following conditions (9) to (11) are satisfied.

$$f_1 = f_P + f_B + f_L > f_S$$

hence $$f_L > f_S - f_P - f_B \tag{9}$$
$$f_3 = f_R + f_B + f_L < f_T$$

hence $$f_L < f_T - f_R - f_B \tag{10}$$
$$f_4 = f_T + f_B + f_L > f_W$$

hence $$f_L > f_W - f_T - f_B \tag{11}$$

it is possible for the band of the low channel broadcasting signal, the band of the local oscillator signal upon receiving the low channels, the band of the high channel broadcasting signal, and the band of the local oscillator signal upon receiving the high channel not to overlap.

The numerical values of $f_L$ for a tuner receiving the Japanese VHF broadcasting signal at present in view of the above conditions (9) to (11) are stated in the dollowing conditions (12) to (14), respectively:

$$f_L > f_S - f_P - f_B = 12\text{MHz} \tag{12}$$

$$f_L < f_T - f_R - f_B = 62\text{MHz} \tag{13}$$

$$f_L > f_W - f_T - f_B = 46\text{MHz} \tag{14}$$

Any frequency $f_L$ that satisfies condition (14) will also satisfy condition (12). Thus, from the above conditions the following condition (15) is obtained:

$$46\text{MHz} < f_L < 62\text{MHz} \tag{15}$$

Combining the requirements of (7) and (15) the following condition (16) is obtained.

$$60\text{MHz} < f_L < 62\text{MHz} \tag{16}$$

The video intermediate frequency $f_{px}$ will then satisfy the following condition (17)

$$64.75\text{MHz} < f_{Px} < 66.75\text{MHz} \tag{17}$$

Applying conditions (1), (2), and (3) to the U.S. frequency allocations for VHF television gives:

$$f_L > \frac{f_S - f_P - f_B}{2} = \frac{88 - 54 - 6}{2} = 14\text{MHz} \tag{18}$$

and $$f_L > \frac{f_W - f_T - f_B}{2} = \frac{216 - 174 - 6}{2} = 18\text{MHz} \tag{19}$$

and either $$f_L < \frac{2f_W - f_S - f_B}{2} = \frac{108 - 88 - 6}{2} = 7\text{MHz} \tag{20}$$

or $$f_L > \frac{2f_S - f_P - f_B}{2} = \frac{176 - 54 - 6}{2} = 58\text{MHz} \tag{21}$$

Any frequency $f_L$ that is greater than 14 MHz cannot also be less than 7MHz, so the alternative represented by condition (20) is not permissible in the United States. Any frequency $f_L$ greater than 58 MHz will also be greater than 18MHz and 14MHz. Therefore, condition (21) places a lower limit on $f_L$ in the United States, but since a lowest intermediate frequency $f_L$ of 58MHz would cause the i.f. band to overlap channels 2 and 3, that would not be acceptable. The lowest intermediate frequency $f_L$ would not only have to be above 58MHz but above 88MHz to avoid overlapping any lower band channels.

Applying conditions (9), (10), and (11) to the U.S. frequency allocations gives:

$$f_L > f_S - f_P - f_B = 88 - 54 - 6 = 28\text{MHz} \tag{22}$$

$$f_L < f_T - f_R - f_B = 174 - 82 - 6 = 86\text{MHz} \tag{23}$$

$$f_L > f_W - f_T - f_B = 216 - 174 - 6 = 36\text{MHz} \tag{24}$$

Conditions (22) through (24) would be met by the following condition (25)

$$36\text{MHz} < f_L < 86 \tag{25}$$

but this would still place the i.f. band within the lower VHF band. If $f_L$ must be greater than $f_S$, the local oscillator frequency required to convert the highest lower band channel, channel 6, would be determined by $$f_L = f_6 - f_S > f_S$$

or $$f_6 > 2f_S \tag{26}$$

Since $f_S$ is 88MHz, $f_6$ would be greater than 176MHz. Thus, condition (23), which is obtained by setting the highest local oscillator frequency for the lower band so that it will be below the upper band, cannot be met. However, the filter 12L in FIG. 1, which is the filter in use during reception of the lower band would prevent upper band signals from being received, anyway, so that there would be no interference.

The i.f. band should also be below the lowest second harmonic frequency, which, in the United States, is 108MHz, the second harmonic of $f_P$. Thus, the maximum frequency for $f_L$ would be $2f_P - f_B$. The lower and upper limits for $f_L$ would be $$88\text{MHz} < f_L < 102\text{MHz} \tag{27}$$

The video intermediate frequency $f_{px}$ is equal to $f_L + 4.75\text{MHz}$, and so the range for $f_{px}$ would be $$92.75\text{MHz} < f_{px} < 106.75\text{MHz} \tag{28}$$

A secondary distortion component having a frequency equal to the difference among frequencies of each channel signal may be generated in the high frequency amplifier circuit 13 but not frequency-converted in the mixer 15 to the i.f. band.

Figure 2:
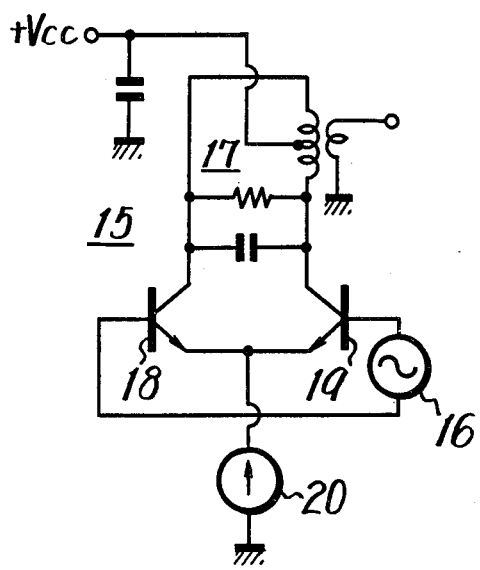
FIG. 2 is a schematic diagram of a mixer suitable for use in the circuit shown in FIG. 1.

Mixer 15 formed of two transistors 18 and 19 connected differentially and having a current source 20 connected to the emitters of both of these transistors is shown in FIG. 2. The current source 20 converts the output signal from the high frequency amplifier 13 to a current to be applied to the emitters of both transistors, and the local oscillator 16 is connected between the bases of the transistors. The band pass filter 17 for the intermediate frequency signal is connected to the collectors of the transistors 18 and 19 in push-pull so that the secondary distortion components are cancelled. As a result, no secondary distortion components are delivered through the band pass filter 17.

As described above, according to the present invention, without the provision of the frequency selection circuit switched at every channel, the occurrence of any image frequency signal obstacle caused by the other channel signals is prevented and the occurrence of unnecessary signals caused by second harmonic distortion is avoided. Thus, the tuner of the invention, although having a very simple construction, can receive any desired channel signal without interference.

Further, with the invention the band of broadcasting signals and the band of the local oscillator signal can be separated, so that even if the local oscillation signal leaks out, this leakage signal does not act as a jamming signal for other receivers located nearby.

In the above description, both the Japanese VHF signal reception conditions are exemplified, but it may be apparent that the same principles can be applied for any other VHF signal reception.

It will be apparent that many modifications and variations could be affected by one skilled in the art without departing from the true scope of the novel concepts of the present invention.

What is claimed is:

1. A tuner for receiving a broadcast signal on a selected channel of a group of channels in spaced frequency bands, said frequency bands including a lower band comprising a plurality of lower band channels and an upper band comprising a plurality of upper band channels, said tuner comprising:
    first filter, means having a fixed pass band tuned to pass said lower band signals;
    second filter means having a fixed pass band tuned to pass said upper band signals;
    third filter means having a pass band with an upper cut-off frequency below the second harmonic of the lowest frequency of said upper band;
    switching means connected to said first and second filter means to provide a signal path through a selective one of said first and second filter means and said third filter means;
    a mixer connected to said third filter means to receive the output signal thereof;
    a local oscillator connected to said mixer to supply thereto a frequency-converting signal having a higher frequency than the highest frequency of a selected channel to convert the frequency of said selected channel in the output signal of said third filter means to an intermediate frequency band having a lowest frequency $f_L$ determined by the following conditions:

$$f_L > \frac{f_S - f_P - f_B}{2}$$

and $$f_L > \frac{f_W - f_T - f_B}{2}$$

and one of the following:

$$f_L < \frac{2f_P - f_S - f_B}{2}$$
$$f_L > \frac{2f_S - f_P - f_B}{2}$$

where:
$f_B$ is the bandwidth of each channel,
$f_P$ is the lowest frequency in the lower band,
$f_S$ is the highest frequency in the lower band,
$f_T$ is the lowest frequency in the upper band, and
$f_W$ is the highest frequency in the upper band.

2. A tuner as claimed in claim 1 comprising high frequency amplifier means connected in cascade with and ahead of said third filter means.

3. A tuner as claimed in claim 2 in which said amplifier means is connected in cascade between said first and second filter means and said third filter means.

4. A tuner as claimed in claim 2 in which said switching means is connected to output terminals of each of said first and second filter means and comprises an output terminal connected to said high frequency amplifier means to supply to said amplifier means, selectively, either lower band signals that pass through said first filter means or upper band signals that pass through said second filter means.

5. A tuner as claimed in claim 1 in which said lower band is the lower television VHF band having a lowest frequency of about 54MHz and a highest frequency of about 88MHz, and said upper band is the upper television VHF band having a lowest frequency of about 174MHz and a highest frequency of about 216MHz and $f_L > 88\text{MHz}$.

6. A tuner as claimed in claim 5 comprising an intermediate frequency band filter connected to said mixer and having a pass band not substantially greater in width than $f_B$ and having an upper pass band frequency less than 108MHz.

7. A tuner as claimed in claim 1, in which said third filter means is a low pass filter which passes therethrough said lower band signals.

8. A tuner as claimed in claim 1, in which said third filter means is a band pass filter which passes therethrough said upper band signals.